US009825627B2

(12) United States Patent
Li et al.

(10) Patent No.: US 9,825,627 B2
(45) Date of Patent: Nov. 21, 2017

(54) APPARATUS FOR PERFORMING SIGNAL DRIVING IN AN ELECTRONIC DEVICE WITH AID OF DIFFERENT TYPES OF DECOUPLING CAPACITORS FOR PRE-DRIVER AND POST-DRIVER

(71) Applicant: MEDIATEK INC., Hsin-Chu (TW)

(72) Inventors: An-Siou Li, New Taipei (TW); Shang-Pin Chen, Hsinchu County (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/183,804

(22) Filed: Jun. 16, 2016

(65) Prior Publication Data
US 2017/0040995 A1 Feb. 9, 2017

Related U.S. Application Data

(60) Provisional application No. 62/202,619, filed on Aug. 7, 2015.

(51) Int. Cl.
*H03K 3/00* (2006.01)
*H03K 17/687* (2006.01)
*G11C 5/14* (2006.01)
*G11C 7/10* (2006.01)
*G11C 29/02* (2006.01)
*G11C 29/04* (2006.01)

(52) U.S. Cl.
CPC ............. *H03K 17/687* (2013.01); *G11C 5/14* (2013.01); *G11C 7/1057* (2013.01); *G11C 7/1069* (2013.01); *G11C 29/021* (2013.01); *G11C 29/028* (2013.01); *G11C 2029/0409* (2013.01)

(58) Field of Classification Search
CPC .................................................... H03K 17/687
USPC .......................................................... 327/111
See application file for complete search history.

(56) References Cited

U.S. PATENT DOCUMENTS

| 6,097,973 A * | 8/2000 | Rabe .................. H02J 9/002 320/166 |
| 6,844,771 B1 * | 1/2005 | Chen .................. H01L 27/0203 327/379 |
| 8,598,950 B2 * | 12/2013 | Khesbak ............... H03F 1/0222 330/10 |

(Continued)

FOREIGN PATENT DOCUMENTS

WO 2013147727 A1 10/2013
WO 2014074782 A1 5/2014

*Primary Examiner* — Ryan Jager
(74) *Attorney, Agent, or Firm* — Winston Hsu

(57) ABSTRACT

An apparatus for performing signal driving in an electronic device may include a decoupling capacitor and at least one switching unit (e.g. one or more switching units). The decoupling capacitor may have a first terminal and a second terminal, and may be positioned in an output stage within the electronic device and coupled between a first predetermined voltage level and another predetermined voltage level, where the apparatus may perform signal driving with aid of the output stage. In addition, the aforementioned at least one switching unit may be coupled between one terminal of the first and the second terminals of the decoupling capacitor and at least one of the first predetermined voltage level and the other predetermined voltage level, and may be arranged for selectively disabling the decoupling capacitor.

15 Claims, 4 Drawing Sheets

(56) References Cited

U.S. PATENT DOCUMENTS

| | | | |
|---|---|---|---|
| 9,257,940 B2* | 2/2016 | Khesbak | H03F 1/0222 |
| 2009/0058514 A1* | 3/2009 | Sato | H02M 1/36 |
| | | | 327/543 |
| 2009/0115505 A1 | 5/2009 | Lee | |
| 2010/0052765 A1* | 3/2010 | Makino | H03K 19/00361 |
| | | | 327/384 |
| 2010/0308663 A1 | 12/2010 | Agarwal | |
| 2011/0084552 A1* | 4/2011 | F.ae butted.revaag | H02J 1/10 |
| | | | 307/31 |
| 2012/0008443 A1* | 1/2012 | Hebig | G11C 7/02 |
| | | | 365/203 |
| 2012/0146731 A1* | 6/2012 | Khesbak | H03F 1/0222 |
| | | | 330/295 |
| 2013/0214862 A1* | 8/2013 | Presti | H03F 3/24 |
| | | | 330/151 |
| 2015/0303912 A1* | 10/2015 | Coutts | G06F 1/26 |
| | | | 307/29 |

* cited by examiner

APPARATUS FOR PERFORMING SIGNAL DRIVING IN AN ELECTRONIC DEVICE WITH AID OF DIFFERENT TYPES OF DECOUPLING CAPACITORS FOR PRE-DRIVER AND POST-DRIVER

CROSS REFERENCE TO RELATED APPLICATIONS

This application claims the benefit of U.S. Provisional Application No. 62/202,619, which was filed on 2015 Aug. 7 and is included herein by reference.

BACKGROUND

The present invention relates to decoupling capacitors of an output stage for multi-supply application and performance control of integrated circuits (ICs) (e.g. input/output (I/O) signal control for a plurality of I/O terminals of a semiconductor chip and decoupling capacitor control for these I/O terminals), and more particularly, to an apparatus for performing signal driving in an electronic device.

According to the related art, regarding double data rate fourth-generation synchronous dynamic random-access memory (DDR4 SDRAM) specifications, a variant of the lower power DDR4 (LPDDR4) specification is proposed and may be called LPDDR4x, where the supply voltage of an output stage may be only 0.4 Volts (V), rather than 1.1 V of the LPDDR4 specification. Based on this design, some problems such as some side effects may occur. For example, when the supply voltage of 0.4 V (rather than 1.1 V) is applied, the capacitance of a decoupling capacitor may become only 30% of the original capacitance value approximately, causing the performance of the decoupling capacitor to be degraded. Although increasing the area that the decoupling capacitor occupies on an IC may be helpful on achieving the same decoupling effect, the area of the decoupling capacitor may become approximately 333% of the original area, causing the associated costs of the IC to be greatly increased. Therefore, a novel architecture is required for improving the performance of ICs with fewer side effects.

SUMMARY

It is an objective of the claimed invention to provide an apparatus for performing signal driving in an electronic device, in order to solve the above-mentioned problems.

It is another objective of the claimed invention to provide an apparatus for performing signal driving in an electronic device, in order to enhance performance control of an electronic device with fewer side effects.

According to at least one preferred embodiment, an apparatus for performing signal driving in an electronic device is provided. For example, the apparatus may comprise a decoupling capacitor and at least one switching unit (e.g. one or more switching units, such as one or more switching circuits). The decoupling capacitor may have a first terminal and a second terminal, and may be positioned in an output stage within the electronic device and coupled between a first predetermined voltage level and another predetermined voltage level, where the apparatus may perform signal driving with aid of the output stage. In addition, the aforementioned at least one switching unit may be coupled between one terminal of the first and the second terminals of the decoupling capacitor and at least one of the first predetermined voltage level and the other predetermined voltage level. Additionally, the aforementioned at least one switching unit may be arranged for selectively disabling the decoupling capacitor.

In some embodiments, under control of the aforementioned at least one switching unit, the one terminal of the first and the second terminals of the decoupling capacitor may be selectively coupled to one predetermined voltage level within the first predetermined voltage level and the other predetermined voltage level. In addition, another terminal of the first and the second terminals of the decoupling capacitor may be coupled to another predetermined voltage level within the first predetermined voltage level and the other predetermined voltage level. In some embodiments, the aforementioned at least one switching unit may comprise a first switching unit, and the first switching unit may have a first terminal coupled to the first predetermined voltage level and have a second terminal coupled to the one terminal of the first and the second terminals of the decoupling capacitor. In some embodiments, the aforementioned at least one switching unit may comprise a second switching unit, and the second switching unit may have a first terminal coupled to the other predetermined voltage level and have a second terminal coupled to the one terminal of the first and the second terminals of the decoupling capacitor.

In some embodiments, a partial circuit corresponding to the decoupling capacitor within the output stage may be arranged to perform signal driving according to the first predetermined voltage level or according to a second predetermined voltage level, where the second predetermined voltage level may be higher than the first predetermined voltage level. In addition, the aforementioned at least one switching unit may selectively disable the decoupling capacitor to protect the decoupling capacitor. In some embodiments, the apparatus may further comprise a post-driver that is positioned in the output stage and coupled between the first predetermined voltage level and the other predetermined voltage level and further coupled between a second predetermined voltage level and the other predetermined voltage level. The post-driver may be arranged for performing signal driving according to the first predetermined voltage level or according to the second predetermined voltage level, where the second predetermined voltage level is higher than the first predetermined voltage level. In some embodiments, the apparatus may further comprise a pre-driver that is positioned in the output stage and coupled between the second predetermined voltage level and the other predetermined voltage level. The pre-driver may be arranged for performing signal driving according to the second predetermined voltage level through the post-driver, where the post-driver is coupled to the pre-driver. According to some embodiments, the apparatus may further comprise another decoupling capacitor that is positioned in the output stage and coupled between the second predetermined voltage level and the other predetermined voltage level. For example, the decoupling capacitor may be a first Metal Oxide Semiconductor Field Effect Transistor (MOSFET), and the other decoupling capacitor may be a second MOSFET, where the first MOSFET and the second MOSFET may have different oxide thicknesses. For example, the oxide thickness of the first MOSFET may be less than that of the second MOSFET.

According to at least one preferred embodiment, an apparatus for performing signal driving in an electronic device is provided, where the apparatus may comprise an output stage that is positioned within the electronic device and coupled between a first predetermined voltage level and another predetermined voltage level. The output stage may be arranged for performing signal driving for the electronic device. For example, the output stage may comprise a decoupling capacitor and at least one switching unit (e.g. one or more switching units, such as one or more switching circuits). The decoupling capacitor may have a first terminal and a second terminal, and may be coupled between the first predetermined voltage level and the other predetermined voltage level. In addition, the aforementioned at least one switching unit may be coupled between one terminal of the first and the second terminals of the decoupling capacitor and at least one of the first predetermined voltage level and the other predetermined voltage level. Additionally, the aforementioned at least one switching unit may be arranged for selectively disabling the decoupling capacitor.

In some embodiments, the output stage may further comprise a post-driver that is positioned in the output stage and coupled between the first predetermined voltage level and the other predetermined voltage level and further coupled between a second predetermined voltage level and the other predetermined voltage level. The post-driver may be arranged for performing signal driving according to the first predetermined voltage level or according to the second predetermined voltage level, where the second predetermined voltage level is higher than the first predetermined voltage level. In some embodiments, the output stage may further comprise a pre-driver that is positioned in the output stage and coupled between the second predetermined voltage level and the other predetermined voltage level. The pre-driver may be arranged for performing signal driving according to the second predetermined voltage level through the post-driver, where the post-driver is coupled to the pre-driver. According to some embodiments, the output stage may further comprise another decoupling capacitor that is positioned in the output stage and coupled between the second predetermined voltage level and the other predetermined voltage level. For example, the decoupling capacitor may be a first Metal Oxide Semiconductor Field Effect Transistor (MOSFET), and the other decoupling capacitor may be a second MOSFET, where the first MOSFET and the second MOSFET may have different oxide thicknesses. For example, the oxide thickness of the first MOSFET may be less than that of the second MOSFET.

It is an advantage of the present invention that the present invention apparatus can enhance performance control of ICs, such as input/output (I/O) signal control for a plurality of I/O terminals of a semiconductor chip. In addition, the present invention apparatus can enhance performance control of an electronic device with fewer side effects. As a result, the related art problems can be alleviated or prevented.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
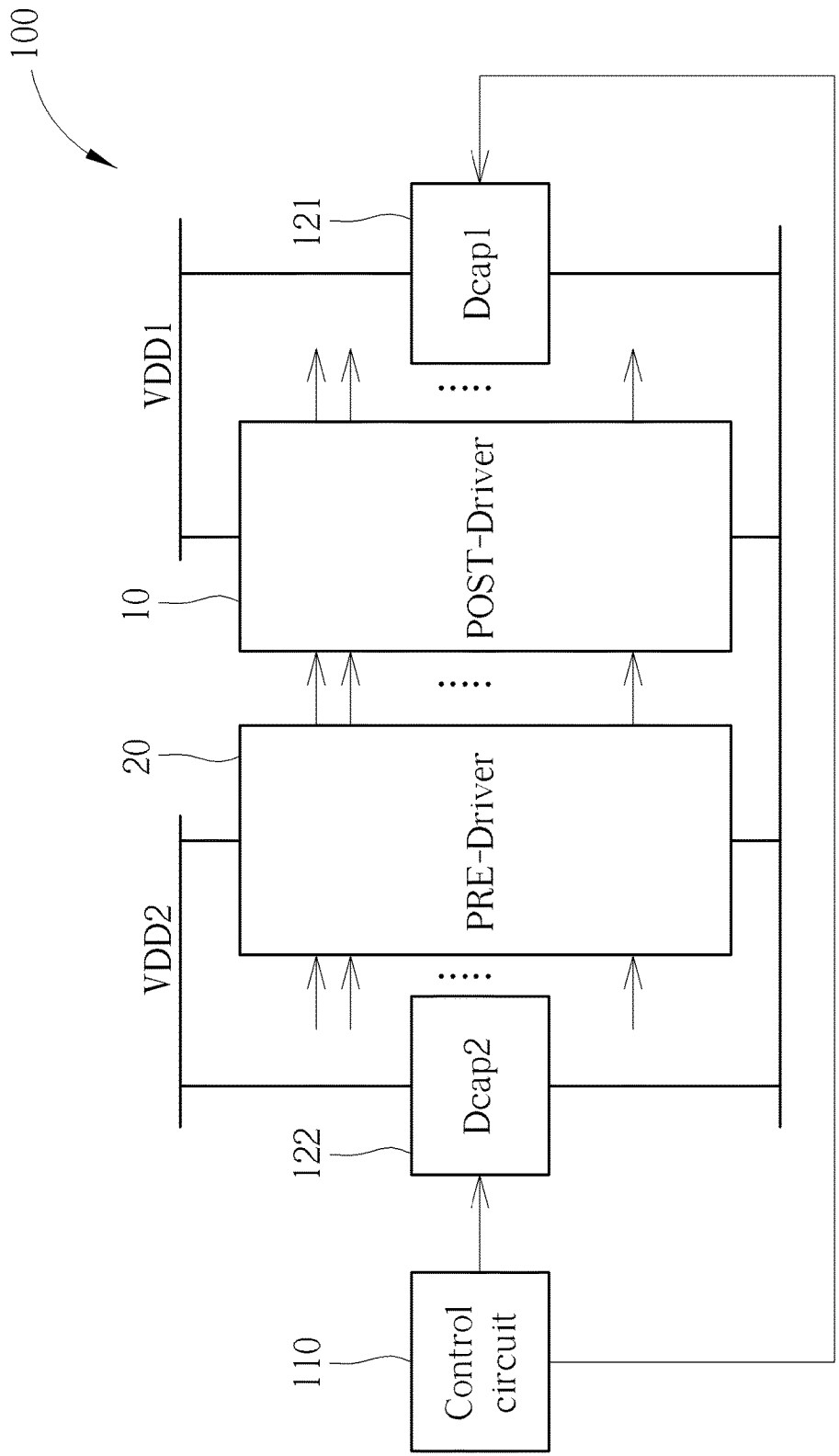
FIG. 1 is a diagram of an apparatus for performing signal driving in an electronic device according to an embodiment of the present invention.

FIG. 1 is a diagram of an apparatus 100 for performing signal driving in an electronic device according to an embodiment of the present invention, where the apparatus may comprise at least one portion of the electronic device. For example, the apparatus may comprise a portion of the electronic device mentioned above, and more particularly, can be at least one hardware circuit such as at least one integrated circuit (IC) within the electronic device and associated circuits thereof. In another example, the apparatus can be the whole of the electronic device mentioned above. In another example, the apparatus may comprise a system comprising the electronic device mentioned above (e.g. a wireless communications system comprising the electronic device). Examples of the electronic device may include, but not limited to, a multifunctional mobile phone, a tablet, and a laptop computer. According to this embodiment, the apparatus 100 may comprise a memory control circuit having a set of memory input/output (I/O) terminals, and the memory control circuit may be arranged for controlling a random-access memory (RAM) such as a double data rate fourth-generation synchronous dynamic RAM (DDR4 SDRAM), and may access the RAM through the set of memory I/O terminals. For example, the memory control circuit and the RAM may be implemented with different ICs, respectively. In another example, the memory control circuit and the RAM may be integrated into the same IC.

As shown in FIG. 1, the apparatus 100 may comprise a control circuit 110 that is positioned in the memory control circuit, and may further comprise some driver circuits such as a post-driver 10 and a pre-driver 20 that are positioned in the memory control circuit, for performing signal driving to control or access the RAM through the output terminals of the post-driver 10, and may comprise decoupling capacitor circuits 121 and 122, where the post-driver 10 and the pre-driver 20 may operate according to different power lines. For example, the post-driver 10 and the decoupling capacitor circuit 121 may be coupled between a first power line VDD1 having a supply voltage VDD1 and a reference line having a predetermined reference voltage (e.g. a reference voltage VSS), and the pre-driver 20 and the decoupling capacitor circuit 122 may be coupled between a second power line VDD2 having a supply voltage VDD2 and the reference line having the predetermined reference voltage (e.g. the reference voltage VSS). In addition, the decoupling capacitor circuit 121 may comprise a first set of decoupling capacitors and one or more switches (e.g. one or more switching circuits) that are coupled to at least one portion of the first set of decoupling capacitors, and each of the one or more switches in the decoupling capacitor circuit 121 is coupled to a decoupling capacitor in the first set of decoupling capacitors. For example, the one or more switches (e.g. one or more switching circuits) in the decoupling capacitor circuit 121 may be implemented with Metal Oxide Semiconductor Field Effect Transistors (MOSFETs), and the first set of decoupling capacitors in the decoupling capacitor circuit 121 may also be implemented with MOSFETs. Additionally, the decoupling capacitor circuit 122 may comprise a second set of decoupling capacitors and one or more switches (e.g. one or more switching circuits) that are coupled to at least one portion of the second set of decoupling capacitors, and each of the one or more switches in the decoupling capacitor circuit 122 is coupled to a decoupling capacitor in the second set of decoupling capacitors. For example, the one or more switches (e.g. one or more switching circuits) in the decoupling capacitor circuit 122 may be implemented with MOSFETs, and the second set of decoupling capacitors in the decoupling capacitor circuit 122 may also be implemented with MOSFETs. Please note that the output terminals of the post-driver 10 can be taken as examples of the memory I/O terminals of the memory control circuit.

According to this embodiment, the control circuit 110 may perform switching control on the one or more switches in the decoupling capacitor circuit 121 to selectively enable or disable one or more decoupling capacitors within the first set of decoupling capacitors in the decoupling capacitor circuit 121. In addition, the control circuit 110 may perform switching control on the one or more switches in the decoupling capacitor circuit 122 to selectively enable or disable one or more decoupling capacitors within the second set of decoupling capacitors in the decoupling capacitor circuit 122. Additionally, the driver circuits such as the post-driver 10 and the pre-driver 20 may perform signal driving to control the RAM. For example, the pre-driver 20 may drive one of the output terminals of the pre-driver 20 to be at one of multiple voltage levels according to the input of at least one of the input terminals of the pre-driver 20. Typically, a voltage level at the one of the input terminals of the pre-driver 20 may indicate a logical value of multiple predetermined logical values (e.g. a logical value 0, or a logical value 1), and the pre-driver 20 may drive the one of the output terminals of the pre-driver 20 to be at the one of multiple voltage levels according to the logical value indicated by the voltage level at the one of the input terminals of the pre-driver 20. As the input terminals of the post-driver 10 are coupled to the output terminals of the pre-driver 20, respectively, the post-driver 10 may drive one of the output terminals of the post-driver 10 to be at one of multiple voltage levels according to the input of at least one (e.g. one or more) of the input terminals of the post-driver 10. For example, the one of the input terminals of the post-driver 10 may be coupled to the one of the output terminals of the pre-driver 20, and a voltage level at the one of the input terminals of the post-driver 10, such as the same voltage level at the one of the output terminals of the pre-driver 20, may represent the logical value indicated by the voltage level at the one of the input terminals of the pre-driver 20, so the logical value indicated by the voltage level at the one of the input terminals of the pre-driver 20 may be transmitted through the post-driver 10 to the RAM. In this embodiment, each of the driver circuits such as the post-driver 10 and the pre-driver 20 may comprise a set of MOSFETs, and may perform signal driving with aid of the set of MOSFETs.

Please note that the architecture shown in FIG. 1 may be utilized as an output stage for multi-supply application, and may be equipped with different types of decoupling capacitors in the decoupling capacitor circuit 121 and the decoupling capacitor circuit 122, respectively. Based on the architecture shown in FIG. 1, the supply voltage VDD1 at the first power line VDD1 and the supply voltage VDD2 at the second power line VDD2 may be different. For example, the supply voltage VDD2 at the second power line VDD2 (e.g. 1.1 Volts (V)) may be higher than the supply voltage VDD1 at the first power line VDD1 (e.g. 0.4 V), and the control circuit 100 may perform switching control to enable different types of decoupling capacitors for the pre-driver 20 and the post-driver 10, respectively, such as a first type of decoupling capacitors corresponding to the supply voltage VDD2 at the second power line VDD2 (e.g. 1.1 V) and a second type of decoupling capacitors corresponding to the supply voltage VDD1 at the first power line VDD1 (e.g. 0.4 V), respectively. According to this embodiment, the first type of decoupling capacitors corresponding to the supply voltage VDD2 at the second power line VDD2 (e.g. 1.1 V) may be implemented with IO devices (which may also be referred to as I/O devices), and the second type of decoupling capacitors corresponding to the supply voltage VDD1 at the first power line VDD1 (e.g. 0.4 V) may be implemented with core devices, where the MOSFET oxide thickness of a core device is less than the MOSFET oxide thickness of an IO device. By utilizing the core devices (e.g. the core device having a thinner oxide layer than that of the IO device) as the second type of decoupling capacitors in the decoupling capacitor circuit 121, the second type of decoupling capacitors may have very high capacitance values when operating under a low voltage level such as 0.4 V. As a result of implementing the electronic device according to the present invention, it is unnecessary to increase the aforementioned area that the decoupling capacitor occupies for achieving the same decoupling effect, and the related art problems (e.g. the problem that the area of the decoupling capacitor may become approximately 333% of the original area, and the problem of the associated costs of the IC being greatly increased) can be prevented.

According to some embodiments, both of the post-driver 10 and the decoupling capacitor circuit 121 may be coupled between the first power line VDD1 having the supply voltage VDD1 and the reference line having the predetermined reference voltage (e.g. the reference voltage VSS), and may be coupled between the second power line VDD2 having the supply voltage VDD2 and the reference line having the predetermined reference voltage (e.g. the reference voltage VSS), where the control circuit 110 may selectively enable one of different hardware configurations respectively corresponding to the supply voltage VDD1 and the supply voltage VDD2, to control both of the post-driver 10 and the decoupling capacitor circuit 121 to operate with a supply voltage selected from the supply voltage VDD1 and the supply voltage VDD2. For example, the hardware configurations may comprise a first hardware configuration corresponding to the supply voltage VDD1, allowing the memory control circuit to access one or more of a first type of DDR4 SDRAMs that operate with a supply voltage having the same voltage level as the supply voltage VDD1.

Based on the first hardware configuration, the control circuit 110 may perform switching control on the decoupling capacitor circuit 121 to enable the second type of decoupling capacitors in the decoupling capacitor circuit 121, such as the core devices mentioned above (e.g. the core device having the thinner oxide layer than that of the IO device). In a situation where the supply voltage VDD2 at the second power line VDD2 (e.g. 1.1 V) is higher than the supply voltage VDD1 at the first power line VDD1 (e.g. 0.4 V), the voltage levels that the post-driver 10 may select for outputting at the one of the output terminals of the post-driver 10 may be partially or totally different from the voltage levels that the pre-driver 20 may select for outputting at the one of the output terminals of the pre-driver 20, where the voltage levels that the post-driver 10 may select for outputting at the one of the output terminals of the post-driver 10 are suitable for accessing the first type of DDR4 SDRAMs that operate with the supply voltage having the same voltage level as the supply voltage VDD1. As the voltage levels from the output terminals of the post-driver 10 are suitable for accessing the first type of DDR4 SDRAMs, the memory control circuit may correctly access the one or more of the first type of DDR4 SDRAMs that operate with the supply voltage having the same voltage level as the supply voltage VDD1.

In addition, the hardware configurations may further comprise a second hardware configuration corresponding to the supply voltage VDD2, allowing the memory control circuit to access one or more of a second type of DDR4 SDRAMs that operate with a supply voltage having the same voltage level as the supply voltage VDD2. Based on the second hardware configuration, the control circuit 110 may perform switching control on the decoupling capacitor circuit 121 to disable the second type of decoupling capacitors in the decoupling capacitor circuit 121, such as the core devices mentioned above (e.g. the core device having the thinner oxide layer than that of the IO device). In a situation where the supply voltage VDD2 at the second power line VDD2 (e.g. 1.1 V) is supplied to both of the post-driver 10 and the decoupling capacitor circuit 121, the voltage levels that the post-driver 10 may select for outputting at the one of the output terminals of the post-driver 10 may correspond to (more particularly, may be equivalent to) the voltage levels that the pre-driver 20 may select for outputting at the one of the output terminals of the pre-driver 20, respectively, where the voltage levels that the post-driver 10 may select for outputting at the one of the output terminals of the post-driver 10 are suitable for accessing the second type of DDR4 SDRAMs that operate with the supply voltage having the same voltage level as the supply voltage VDD2. As the voltage levels from the output terminals of the post-driver 10 are suitable for accessing the second type of DDR4 SDRAMs, the memory control circuit may correctly access the one or more of the second type of DDR4 SDRAMs that operate with the supply voltage having the same voltage level as the supply voltage VDD2. As a result of implementing the electronic device according to the present invention, the apparatus 100 can enhance performance control of ICs, such as I/O signal control for a plurality of I/O terminals of a semiconductor chip (e.g. the set of memory I/O terminals of the memory control circuit), and can enhance performance control of the electronic device with fewer side effects, where the decoupling capacitor control of the output stage implemented according to the apparatus 100 is suitable for multi-supply application, and the switching control corresponding to the second hardware configuration can prevent the core devices in the decoupling capacitor circuit 121 from being damaged by the supply voltage VDD2.

Figure 2:
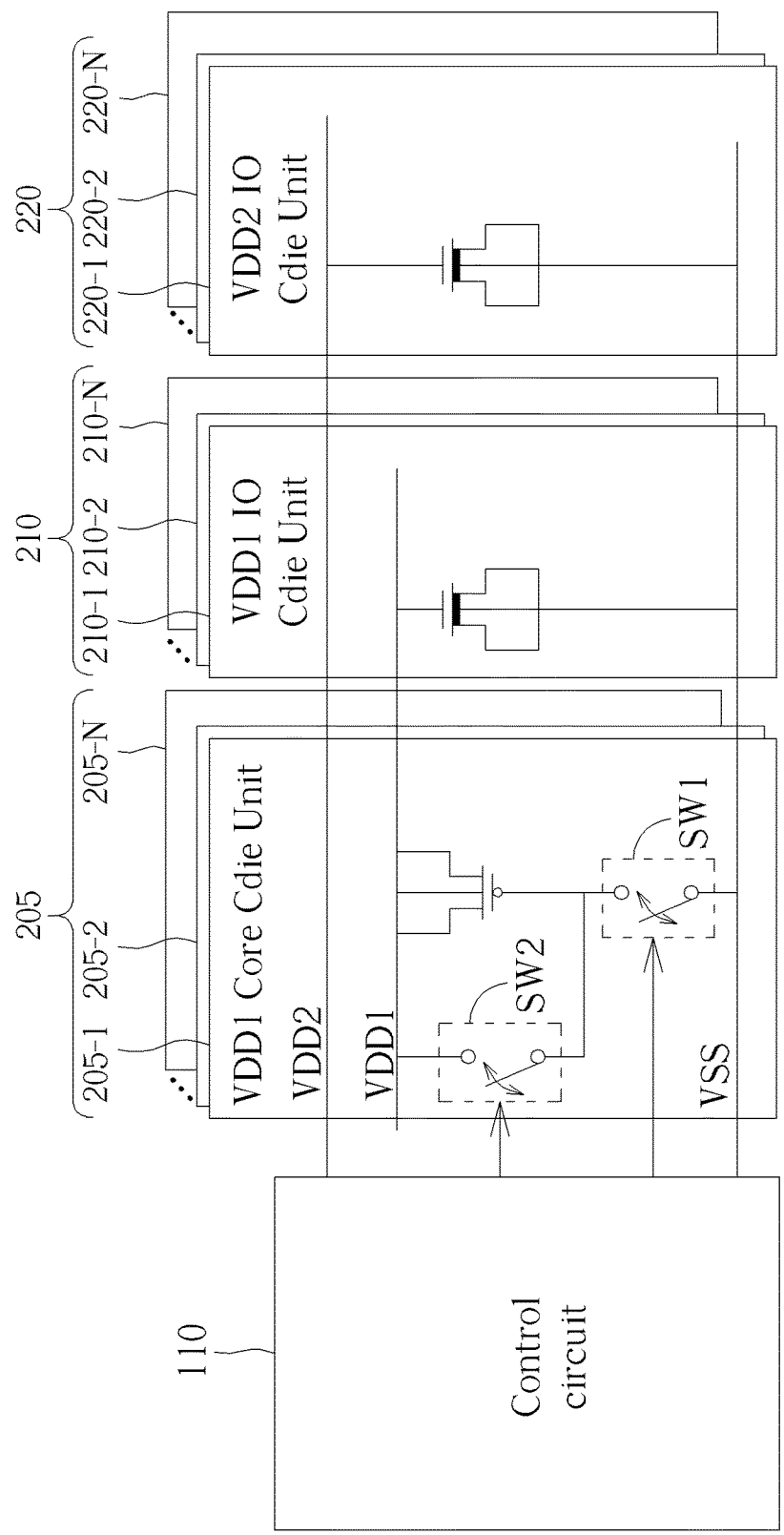
FIG. 2 illustrates some implementation details involved with the apparatus shown in FIG. 1 according to an embodiment of the present invention.

FIG. 2 illustrates some implementation details involved with the apparatus 100 shown in FIG. 1 according to an embodiment of the present invention. For example, the output terminals of the post-driver 10 shown in FIG. 1 may comprise a set of output terminals for transmitting N bits of data in this embodiment, and the decoupling capacitor circuit 121 shown in FIG. 1 may comprise a plurality of decoupling capacitor (Cdie) units corresponding to the N bits, such as a set of VDD1 core Cdie units 205, a set of VDD1 IO Cdie units 210, and a set of VDD2 IO Cdie units 220 in this embodiment, where each set of Cdie units within the set of VDD1 core Cdie units 205, the set of VDD1 IO Cdie units 210, and the set of VDD2 IO Cdie units 220 correspond to the N bits, respectively. As shown in FIG. 2, the set of VDD1 core Cdie units 205 may comprise the VDD1 core Cdie units 205-1, 205-2, . . . , and 205-N respectively corresponding to the N bits, the set of VDD1 IO Cdie units 210 may comprise the VDD1 IO Cdie units 210-1, 210-2, . . . , and 210-N respectively corresponding to the N bits, and the set of VDD2 IO Cdie units 220 may comprise the VDD2 IO Cdie units 220-1, 220-2, . . . , and 220-N respectively corresponding to the N bits. For brevity, only some partial circuits in the VDD1 core Cdie unit 205-1, the VDD1 IO Cdie unit 210-1, and the VDD2 IO Cdie unit 220-1 corresponding to the first bit of the N bits are illustrated in FIG. 2. For example, each of the VDD1 core Cdie units 205-2, . . . , and 205-N may be implemented as a copy of the VDD1 core Cdie unit 205-1, each of the VDD1 IO Cdie units 210-2, . . . , and 210-N may be implemented as a copy of the VDD1 IO Cdie unit 210-1, and each of the VDD2 IO Cdie units 220-2, . . . , and 220-N may be implemented as a copy of the VDD2 IO Cdie unit 220-1. In some examples, additional partial circuits such as some additional components and the associated wiring connections may be integrated into at least one portion of Cdie units (e.g. one or more portions of Cdie units) in the architecture shown in FIG. 2.

According to this embodiment, each core Cdie unit of the VDD1 core Cdie units 205-1, 205-2, . . . , and 205-N may comprise at least one switching circuit (e.g. one or more switching circuits), and the control circuit 100 may perform switching control on the aforementioned at least one switching circuit of the core Cdie unit concerned (e.g. the aforementioned each core Cdie unit of the VDD1 core Cdie units 205-1, 205-2, . . . , and 205-N) to selectively enable or disable the decoupling capacitor in the core Cdie unit concerned, such as the core device mentioned above. For example, the VDD1 core Cdie units 205-1 may comprise the switching circuits SW1 and SW2 shown in FIG. 2, and the control circuit 100 may perform switching control on the switching circuits SW1 and SW2 to selectively enable or disable the decoupling capacitor in the VDD1 core Cdie units 205-1, such as the MOSFET illustrated above the switching circuit SW1 in FIG. 2. In this embodiment, the gate of the MOSFET utilized as the decoupling capacitor in the VDD1 core Cdie units 205-1 is not illustrated with any bold line, indicating that this MOSFET is a core device. Based on the first hardware configuration, the control circuit 110 may perform switching control on the switching circuits SW1 and SW2 (e.g. turn on the switching circuit SW1 and turn off the switching circuit SW2) to enable the decoupling capacitor in the VDD1 core Cdie unit 205-1 (e.g. the core device), and more particularly, may perform switching control on the switching circuits {SW1} and {SW2} of the VDD1 core Cdie units 205-1, 205-2, . . . , and 205-N (e.g. turn on the switching circuit {SW1} and turn off the switching circuit {SW2}) to enable the decoupling capacitors in the VDD1 core Cdie units 205-1, 205-2, . . . , and 205-N (e.g. the core devices), respectively. In addition, based on the second hardware configuration, the control circuit 110 may perform switching control on the switching circuits SW1 and SW2 (e.g. turn off the switching circuit SW1 and turn on the switching circuit SW2) to disable and protect the decoupling capacitor in the VDD1 core Cdie unit 205-1 (e.g. the core device), and more particularly, may perform switching control on the switching circuits {SW1} and {SW2} of the VDD1 core Cdie units 205-1, 205-2, . . . , and 205-N (e.g. turn off the switching circuit {SW1} and turn on the switching circuit {SW2}) to disable and protect the decoupling capacitors in the VDD1 core Cdie units 205-1, 205-2, . . . , and 205-N (e.g. the core devices), respectively. For example, when the control circuit 110 turns on the switching circuit SW2 in the VDD1 core Cdie unit 205-1, the terminals of the MOSFET utilized as the decoupling capacitor in the VDD1 core Cdie unit 205-1 are electrically connected to each other, where the switching circuit SW2 provide a short-circuit path between the gate terminal of this MOSFET and the others of the terminals of this MOSFET Therefore, the apparatus 100 can prevent this MOSFET from being damaged.

As shown in the right half of FIG. 2, each IO Cdie units of the VDD1 IO Cdie units 210-1, 210-2, . . . , and 210-N may comprise a decoupling capacitor that may belong to the first type of decoupling capacitors, and this decoupling capacitor may be implemented with an IO device such as that mentioned above. For example, the VDD1 IO Cdie unit 210-1 may comprise a MOSFET coupled between the first power line VDD1 having the supply voltage VDD1 and the reference line VSS having the predetermined reference voltage VSS. In this embodiment, the gate of the MOSFET utilized as the decoupling capacitor in the VDD1 IO Cdie unit 210-1 is illustrated with a bold line, indicating that this MOSFET is an IO device. In addition, each IO Cdie units of the VDD2 IO Cdie units 220-1, 220-2, . . . , and 220-N may comprise a decoupling capacitor, and this decoupling capacitor may be implemented with an IO device such as that mentioned above. For example, the VDD2 IO Cdie unit 220-1 may comprise a MOSFET coupled between the second power line VDD2 having the supply voltage VDD2 and the reference line VSS having the predetermined reference voltage VSS. In this embodiment, the gate of the MOSFET utilized as the decoupling capacitor in the VDD2 IO Cdie unit 220-1 is illustrated with a bold line, indicating that this MOSFET is an IO device. For brevity, similar descriptions for this embodiment are not repeated in detail here.

According to some embodiments, the decoupling capacitors in the decoupling capacitor circuits 121 and 122 may be implemented with one or more of various kinds of components. Examples of the various kinds of components that are suitable for implementing the decoupling capacitors in the decoupling capacitor circuits 121 and 122 may include, but not limited to, a Cdie, a decoupling capacitor with series resistor (RCdie), a normal capacitor such as a pure capacitor (pure C), a P-type MOSFET (PMOSFET), and an N-type MOSFET (NMOSFET).

According to some embodiments, the post-driver 10 may be implemented with one or more of various kinds of components. Examples of the various kinds of components that are suitable for implementing the post-driver 10 may include, but not limited to, a PMOSFET and an NMOSFET. In addition, based on whether one or more PMOSFETs and/or one or more NMOSFETs are utilized for implementing the post-driver 10, the post-driver 10 may be classified as one of various post-driver types (e.g. a PN driver, an NN driver, or a PP driver).

Figure 3:
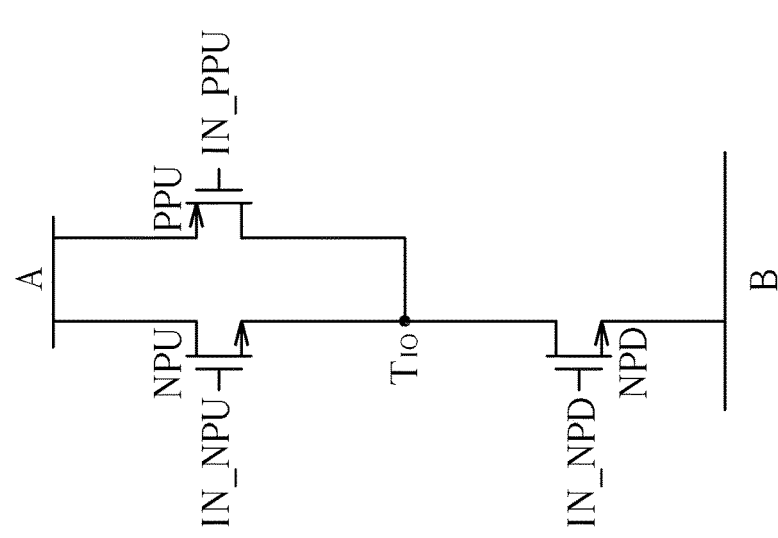
FIG. 3 illustrates an apparatus for performing signal driving with aid of Metal Oxide Semiconductor Field Effect Transistors (MOSFETs) according to an embodiment of the present invention.

FIG. 3 illustrates an apparatus 300 for performing signal driving with aid of MOSFETs according to an embodiment of the present invention. The architecture shown in FIG. 3 can be taken as an example of the post-driver 10 shown in FIG. 1. For example, the terminal $T_{IO}$ can be one of the set of memory I/O terminals, where the apparatus 300 can be positioned in the memory control circuit having the set of memory I/O terminals. In some examples, the terminal $T_{IO}$ can be one of another type of I/O terminals, where the apparatus 300 can be positioned in one of another type of circuits.

As shown in FIG. 3, the apparatus 300 comprises a PMOSFET PPU that is coupled between a predetermined voltage level A (e.g. the supply voltage VDD1 for the first hardware configuration, or the supply voltage VDD2 for the second hardware configuration) and a terminal such as the terminal $T_{IO}$, and further comprises an NMOSFET NPU that is coupled between the predetermined voltage level A and the terminal such as the terminal $T_{IO}$. The PMOSFET PPU is arranged for selectively driving a signal, where the signal passes through the terminal such as the terminal $T_{IO}$. In addition, the NMOSFET NPU is arranged for selectively driving the signal. Additionally, the apparatus 300 further comprises another NMOSFET NPD that is coupled between another predetermined voltage level B (e.g. the reference voltage VSS) and the terminal such as the terminal $T_{IO}$, where the other NMOSFET NPD is arranged for selectively driving the signal mentioned above. Please note that the PMOSFET PPU, the NMOSFET NPU, and the other NMOSFET NPD does not drive the signal at the same time. For example, in a situation where the terminal such as the terminal $T_{IO}$ is one of the set of memory I/O terminals mentioned above, the signal that passes through the terminal such as the terminal $T_{IO}$ can be one of a set of memory I/O signals.

According to this embodiment, any MOSFET within the PMOSFET PPU, the NMOSFET NPU, and the other NMOSFET NPD, such as each of the PMOSFET PPU, the NMOSFET NPU, and the other NMOSFET NPD, may selectively drive the signal to have one of a plurality of logical states. For example, the PMOSFET PPU and the NMOSFET NPU are arranged for selectively driving the signal to correspond to at least one logic state (e.g. one or more logic states) of the plurality of logical states, and the other NMOSFET NPD is arranged for selectively driving the signal to correspond to another logic state of the plurality of logical states, where any two logical states within the plurality of logical states do not exist at the same time.

In practice, the PMOSFET PPU is arranged for selectively driving the signal to have a voltage level associated to the predetermined voltage level A, such as a voltage level that is slightly lower than the predetermined voltage level A, and the NMOSFET NPU is arranged for selectively driving the signal to have another voltage level associated to the predetermined voltage level A, such as another voltage level that is slightly lower than the predetermined voltage level A, where the other NMOSFET NPD is arranged for selectively driving the signal to have a voltage level associated to the other predetermined voltage level B, such as a voltage level that is slightly higher than the other predetermined voltage level B. More particularly, any two voltage levels within the voltage level associated to the predetermined voltage level A, the other voltage level associated to the predetermined voltage level A, and the voltage level associated to the other predetermined voltage level B are different from each other.

For better comprehension, a ground voltage level GND can be taken as an example of the other predetermined voltage level B, and a predetermined voltage level VDD (e.g. the supply voltage VDD1 for the first hardware configuration, or the supply voltage VDD2 for the second hardware configuration) that is higher than the ground voltage level GND can be taken as an example of the predetermined voltage level A. Based on the architecture shown in FIG. 3, the gate control signal IN_PPU of the PMOSFET PPU may selectively turn on the PMOSFET PPU, the gate control signal IN_NPU of the NMOSFET NPU may selectively turn on the NMOSFET NPU, and the gate control signal IN_NPD of the other NMOSFET NPD may selectively turn on the other NMOSFET NPD, where these gate control signals IN_PPU, IN_NPU, and IN_NPD do not turn on the PMOSFET PPU, the NMOSFET NPU, and the other NMOSFET NPD at the same time. For example, the gate control signal IN_PPU of the PMOSFET PPU may selectively turn on the PMOSFET PPU to drive the signal to have the voltage level associated to the predetermined voltage level A, such as the voltage level that is slightly lower than the predetermined voltage level A (e.g. a voltage level that is slightly lower than the predetermined voltage level VDD), and more particularly to pull up the signal to the voltage level associated to the predetermined voltage level A. In another example, the gate control signal IN_NPU of the NMOSFET NPU may selectively turn on the NMOSFET NPU to drive the signal to have the other voltage level associated to the predetermined voltage level A, such as the other voltage level that is slightly lower than the predetermined voltage level A (e.g. a voltage level that is slightly lower than the predetermined voltage level VDD), and more particularly to pull up the signal to the other voltage level associated to the predetermined voltage level A. In another example, the gate control signal IN_NPD of the other NMOSFET NPD may selectively turn on the other NMOSFET NPD to drive the signal to have the voltage level associated to the other predetermined voltage level B, such as the voltage level that is slightly higher than the other predetermined voltage level B (e.g. a voltage level that is slightly higher than the ground voltage level GND), and more particularly to pull down the signal to the voltage level associated to the other predetermined voltage level B.

As the architecture shown in FIG. 3 can be applied to various types of applications, the PMOSFET PPU and the NMOSFET NPU may selectively drive the signal to correspond to the aforementioned at least one logic state (e.g. one or more logic states) of the plurality of logical states, where the voltage level associated to the predetermined voltage level A and the other voltage level associated to the predetermined voltage level A are typically different from each other. For example, in a situation where the voltage level associated to the predetermined voltage level A and the other voltage level associated to the predetermined voltage level A represent the same logic state within the plurality of logical states, the PMOSFET PPU and the NMOSFET NPU may be arranged for selectively driving the signal to correspond to a single logic state within the plurality of logical states, such as the aforementioned same logic state. In some examples, in a situation where the voltage level associated to the predetermined voltage level A and the other voltage level associated to the predetermined voltage level A represent different logic states within the plurality of logical states, respectively, the PMOSFET PPU and the NMOSFET NPU may be arranged for selectively driving the signal to correspond to two logic states within the plurality of logical states. That is, the PMOSFET PPU may selectively drive the signal to correspond to one logic state of the two logic states mentioned above, and the NMOSFET NPU may selectively drive the signal to correspond to the other logic state of the two logic states mentioned above.

Figure 4:
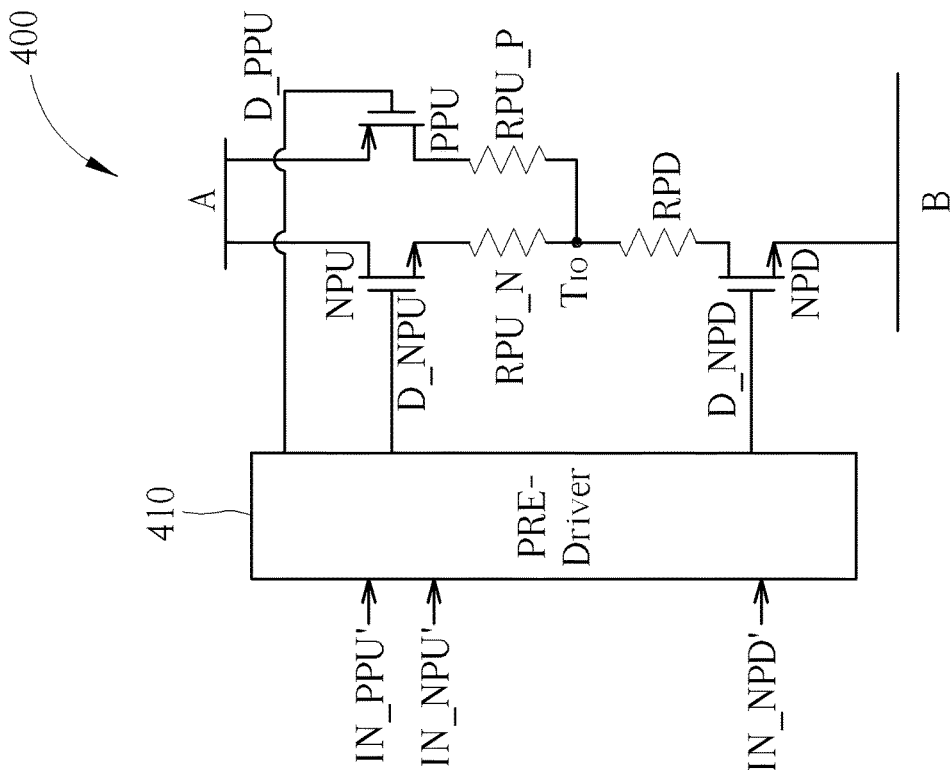
FIG. 4 is a diagram of an apparatus for performing signal driving with aid of MOSFETs according to another embodiment of the present invention.

FIG. 4 is a diagram of an apparatus 400 for performing signal driving with aid of MOSFETs according to another embodiment of the present invention. The left half of the architecture shown in FIG. 4 (e.g. the pre-driver 410) can be taken as an example of the pre-driver 20 shown in FIG. 1, and the right half of the architecture shown in FIG. 4 (e.g. the sub-circuit comprising the components shown in FIG. 3 and further comprising some resistors, such as the portion without the pre-driver 410) can be taken as an example of the post-driver 10 shown in FIG. 1. For example, the terminal $T_{IO}$ can be one of the set of memory I/O terminals such as that mentioned above, where the apparatus 400 can be positioned in the memory control circuit having the set of memory I/O terminals. In some examples, the terminal $T_{IO}$ can be one of another type of I/O terminals, where the apparatus 400 can be positioned in one of another type of circuits.

As shown in FIG. 4, the apparatus 400 may comprise the pre-driver 410, and may comprise the aforementioned PMOSFET PPU and the aforementioned NMOSFET NPU that are coupled between the predetermined voltage level A (e.g. the supply voltage VDD1 for the first hardware configuration, or the supply voltage VDD2 for the second hardware configuration) and the terminal such as the terminal $T_{IO}$, and may further comprise the aforementioned NMOSFET NPD that is coupled between the other predetermined voltage level B (e.g. the reference voltage VSS) and the terminal such as the terminal $T_{IO}$. In comparison with the architecture shown in FIG. 3, the right half of the architecture shown in FIG. 4 (e.g. the sub-circuit that is utilized as the post-driver in the apparatus 400) may further comprise a plurality of resistors RPU_P, RPU_N, and RPD. For example, the resistor RPU_P is coupled between the predetermined voltage level A and the terminal such as the terminal $T_{IO}$, and is arranged for selectively adjusting the current on the driving path that passes through the PMOSFET PPU and is arranged for selectively adjusting the voltage level at the terminal such as the terminal $T_{IO}$, and the resistor RPU_P and the PMOSFET PPU are electrically connected in series. In another example, the resistor RPU_N is coupled between the predetermined voltage level A and the terminal such as the terminal $T_{IO}$, and is arranged for selectively adjusting the current on the driving path that passes through the NMOSFET NPU and is arranged for selectively adjusting the voltage level at the terminal such as the terminal $T_{IO}$, and the resistor RPU_N and the NMOSFET NPU are electrically connected in series. In another example, the resistor RPD is coupled between the predetermined voltage level B and the terminal such as the terminal $T_{IO}$, and is arranged for selectively adjusting the current on the driving path that passes through the other NMOSFET NPD and is arranged for selectively adjusting the voltage level at the terminal such as the terminal $T_{IO}$, and the resistor RPD and the other NMOSFET NPD are electrically connected in series.

In addition, the pre-driver 410 may be coupled to the PMOSFET PPU, the NMOSFET NPU, and the other NMOSFET NPD through the gate control signals D_PPU, D_NPU, and D_NPD, respectively. Please note that the pre-driver 410 of this embodiment may be arranged for generating the control signals such as the gate control signals D_PPU, D_NPU, and D_NPD according to the input signals of the pre-driver 410, such as the control signals IN_PPU', IN_NPU', and IN_NPD'. For example, the logical states of the gate control signals D_PPU, D_NPU, and D_NPD may correspond to the logical states of the control signals IN_PPU', IN_NPU', and IN_NPD', respectively. For brevity, similar descriptions for this embodiment are not repeated in detail here.

Figure 5:
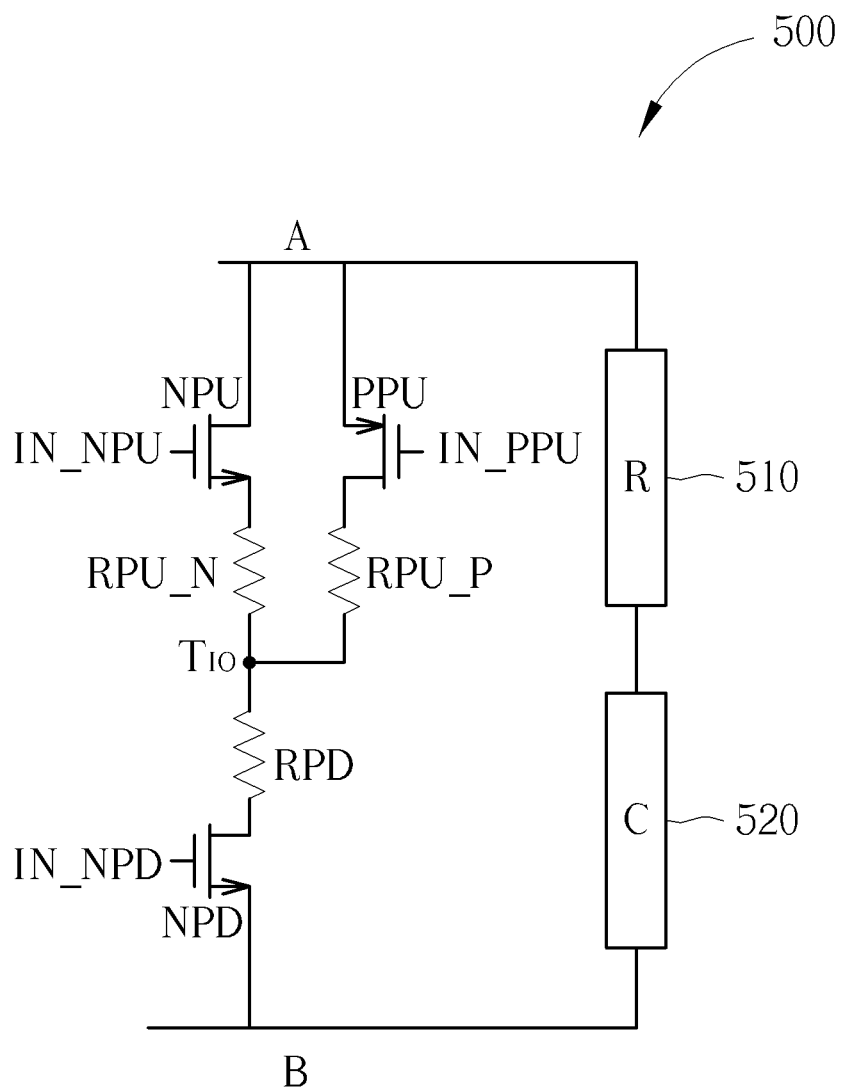
FIG. 5 is a diagram of an apparatus for performing signal driving with aid of MOSFETs according to another embodiment of the present invention.

FIG. 5 is a diagram of an apparatus 500 for performing signal driving with aid of MOSFETs according to another embodiment of the present invention. The architecture shown in FIG. 5 can be taken as an example of the post-driver 10 shown in FIG. 1. For example, the terminal $T_{IO}$ can be one of the set of memory I/O terminals such as that mentioned above, where the apparatus 500 can be positioned in the memory control circuit having the set of memory I/O terminals. In some examples, the terminal $T_{IO}$ can be one of another type of I/O terminals, where the apparatus 500 can be positioned in one of another type of circuits.

As shown in FIG. 5, the apparatus 500 may comprise the aforementioned PMOSFET PPU and the aforementioned NMOSFET NPU that are coupled between the predetermined voltage level A (e.g. the supply voltage VDD1 for the first hardware configuration, or the supply voltage VDD2 for the second hardware configuration) and the terminal such as the terminal $T_{IO}$, and may further comprise the aforementioned NMOSFET NPD that is coupled between the other predetermined voltage level B (e.g. the reference voltage VSS) and the terminal such as the terminal $T_{IO}$, and may further comprise the resistors RPU_P, RPU_N, and RPD mentioned above. In addition, the apparatus 500 may further comprise a resistor 510 (labeled "R" in FIG. 5, for brevity) and a capacitor 520 (labeled "C" in FIG. 5, for brevity) that are coupled between the predetermined voltage level A and the predetermined voltage level B, where the resistor 510 and the capacitor 520 are electrically connected in series. In practice, the apparatus 500 may use the resistor 510 and the capacitor 520 to enhance the R-L-C characteristics of the architecture shown in FIG. 5. For brevity, similar descriptions for this embodiment are not repeated in detail here.

According to some embodiments, the architecture of the post-driver 10 and/or the architecture of the pre-driver 20 may vary. For some implementation details, please refer to U.S. Non-provisional application Ser. No. 14/549,552, which was filed on 2014 Nov. 21 and is included herein by reference.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An apparatus for performing signal driving in an electronic device, the apparatus comprising:
   a decoupling capacitor, having a first terminal and a second terminal, positioned in an output stage within the electronic device and coupled between a first predetermined voltage level and another predetermined voltage level, wherein the apparatus performs signal driving with aid of the output stage; and
   a switching unit, arranged for selectively disabling the decoupling capacitor, the switching unit comprising:
      a first switching unit, having a first terminal coupled to the first predetermined voltage level and having a second terminal coupled to a specific terminal of the first and the second terminals of the decoupling capacitor; and
      a second switching unit, having a first terminal coupled to the other predetermined voltage level and having a second terminal coupled to the specific terminal of the first and the second terminals of the decoupling capacitor.

2. The apparatus of claim 1, wherein under control of the at least one switching unit, the one terminal of the first and the second terminals of the decoupling capacitor is selectively coupled to one predetermined voltage level within the first predetermined voltage level and the other predetermined voltage level; and another terminal of the first and the second terminals of the decoupling capacitor is coupled to another predetermined voltage level within the first predetermined voltage level and the other predetermined voltage level.

3. The apparatus of claim 1, wherein a partial circuit corresponding to the decoupling capacitor within the output stage is arranged to perform signal driving according to the first predetermined voltage level or according to a second predetermined voltage level, wherein the second predetermined voltage level is higher than the first predetermined voltage level; and when the partial circuit corresponding to the decoupling capacitor is arranged to perform signal driving according to the first predetermined voltage level, the at least one switching unit enables the decoupling capacitor.

4. The apparatus of claim 1, wherein the decoupling capacitor comprises a decoupling capacitor with series resistor (RCdie), a pure capacitor, a P-type Metal Oxide Semiconductor Field Effect Transistor (PMOSFET), or a N-type Metal Oxide Semiconductor Field Effect Transistor (NMOSFET).

5. An apparatus for performing signal driving in an electronic device, the apparatus comprising:
   a decoupling capacitor, having a first terminal and a second terminal, positioned in an output stage within the electronic device and coupled between a first predetermined voltage level and another predetermined voltage level, wherein the apparatus performs signal driving with aid of the output stage; and
   at least one switching unit, coupled between one terminal of the first and the second terminals of the decoupling capacitor and at least one of the first predetermined voltage level and the other predetermined voltage level, arranged for selectively disabling the decoupling capacitor;
   wherein a partial circuit corresponding to the decoupling capacitor within the output stage is arranged to perform signal driving according to the first predetermined voltage level or according to a second predetermined voltage level, wherein the second predetermined voltage level is higher than the first predetermined voltage level; and when the partial circuit corresponding to the decoupling capacitor is arranged to perform signal driving according to the second predetermined voltage level, the at least one switching unit disables the decoupling capacitor to protect the decoupling capacitor.

6. The apparatus of claim 5, wherein the partial circuit corresponding to the decoupling capacitor comprises:
   a post-driver, positioned in the output stage and coupled between the first predetermined voltage level and the other predetermined voltage level, arranged for performing signal driving according to the first predetermined voltage level or according to the second predetermined voltage level.

7. The apparatus of claim 6, further comprising:
a pre-driver, positioned in the output stage and coupled between the second predetermined voltage level and the other predetermined voltage level, arranged for performing signal driving according to the second predetermined voltage level through the post-driver, wherein the post-driver is coupled to the pre-driver.

8. The apparatus of claim 7, further comprising:
another decoupling capacitor, positioned in the output stage and coupled between the second predetermined voltage level and the other predetermined voltage level.

9. The apparatus of claim 8, wherein the decoupling capacitor is a first Metal Oxide Semiconductor Field Effect Transistor (MOSFET), and the other decoupling capacitor is a second MOSFET, wherein the first MOSFET and the second MOSFET have different oxide thicknesses.

10. The apparatus of claim 9, wherein the oxide thickness of the first MOSFET is less than that of the second MOSFET.

11. An apparatus for performing signal driving in an electronic device, the apparatus comprising:
an output stage, positioned within the electronic device and coupled between a first predetermined voltage level and another predetermined voltage level, arranged for performing signal driving for the electronic device, wherein the output stage comprises:
a decoupling capacitor, having a first terminal and a second terminal, coupled between the first predetermined voltage level and the other predetermined voltage level; and
a switching unit, arranged for selectively disabling the decoupling capacitor, the switching unit comprising:
a first switching unit, having a first terminal coupled to the first predetermined voltage level and having a second terminal coupled to a specific terminal of the first and the second terminals of the decoupling capacitor; and
a second switching unit, having a first terminal coupled to the other predetermined voltage level and having a second terminal coupled to the specific terminal of the first and the second terminals of the decoupling capacitor.

12. The apparatus of claim 11, wherein the output stage further comprises:
a pre-driver, positioned in the output stage and coupled between the second predetermined voltage level and the other predetermined voltage level, arranged for performing signal driving according to the second predetermined voltage level through the post-driver, wherein the post-driver is coupled to the pre-driver.

13. The apparatus of claim 12, wherein the output stage further comprises:
another decoupling capacitor, positioned in the output stage and coupled between the second predetermined voltage level and the other predetermined voltage level.

14. The apparatus of claim 13, wherein the decoupling capacitor is a first Metal Oxide Semiconductor Field Effect Transistor (MOSFET), and the other decoupling capacitor is a second MOSFET, wherein the first MOSFET and the second MOSFET have different oxide thicknesses.

15. The apparatus of claim 14, wherein the oxide thickness of the first MOSFET is less than that of the second MOSFET.

* * * * *